United States Patent [19]

Cook et al.

[11] Patent Number: 4,825,147
[45] Date of Patent: Apr. 25, 1989

[54] CAPACITANCE MEASURING METHOD AND APPARATUS

[75] Inventors: Terry D. Cook; Ross Ortman, both of Sioux Falls, S. Dak.

[73] Assignee: Sencore, Inc., Sioux Falls, S. Dak.

[21] Appl. No.: 244,041

[22] Filed: Sep. 14, 1988

[51] Int. Cl.$^4$ .............................................. G01R 27/26
[52] U.S. Cl. .............................. 324/60 C; 324/60 CD
[58] Field of Search ....................... 324/60 C, 60 CD; 73/718

[56] References Cited

U.S. PATENT DOCUMENTS 3,824,459 7/1974 Uchida ........................ 324/60 CD
4,001,676 1/1977 Hile et al. .................... 324/60 CD
4,429,271 1/1984 Doubek et al. ............... 324/60 CD

FOREIGN PATENT DOCUMENTS 864185 9/1981 U.S.S.R. ............................ 324/60 C

Primary Examiner—Reinhard J. Eisenzopf
Assistant Examiner—Maura K. Regan
Attorney, Agent, or Firm—Edmond T. Patnaude

[57] ABSTRACT

A train of constant current pulses is applied to a capacitor to raise the voltage across the capacitor from a first predetermined level to a second predetermined level. The voltage across the capacitor is measured only during the intervals between the current pulses, and the number of applied pulses is counted and used to calculate the capacitance of the capacitor.

7 Claims, 2 Drawing Sheets

CAPACITANCE MEASURING METHOD AND APPARATUS

The present invention relates in general to the art of measuring capacitance, and it relates in particular to a new and improved method and apparatus for measuring the capacitance of capacitors having very high equivalent series resistance and very high capacitance.

BACKGROUND OF THE INVENTION

The prior art methods of measuring the capacitance of large capacitors having an appreciable amount of ESR (equivalent series resistance) have been relatively time consuming, requiring several minutes for each measurement. Attempts to speed up such tests have introduced appreciable errors, primarily because of the ESR.

One such prior art method requires the measurement of the reactance of the capacitor while a signal having a predetermined frequency is applied to the capacitor. When the capacitance is high, the capacitive reactance is very low, usually less than one ohm, wherefor it is very difficult to make an accurate measurement of the reactance. Furthermore, even relatively low values of ESR make the accurate measurement of the capacitive reactance practically impossible.

In a second such method called the RC test, the capacitor under test is charged to a predetermined voltage level through a resistor having a known resistance. The time required to charge the capacitor to the predetermined level is measured and used to calculate the value of capacitance. Since the time required to charge the capacitor is proportional to the capacitance, it takes a long time to measure the capacitance of a large capacitor. This test can be speeded up by reducing the resistance of the series connected resistor through which the capacitor is charged, but as that resistance is lowered the effect of ESR increases and reduces the accuracy of the measurement.

Another commonly used method is known as the constant current test. When using this method the capacitor is connected across a constant current source and the time required to charge the capacitor between two different voltage levels is measured and used to calculate the capacitance. Where ESR is present and the capacitance is high, the time required to accurately measure the capacitance is necessarily long since the charging current must be kept relatively low to minimize the effect of ESR.

Recently a new type of capacitor having very high capacitance and very high ESR has become commercially available. Because of its construction it is known as the double layer capacitor. Testing these capacitors with known test methods has exacerbated the problems associated with time and accuracy. For example, when using the RC test to measure a capacitance of 100 $\mu$F., it takes 100 milliseconds to charge the capacitor to sixty-three percent of its full charge through a 1000 ohm resistor Using the same 1000 ohm series resistor to test a ten farad capacitor, it would take 166.6 minutes or 2.7 hours to make the same test. It would seem logical to reduce this time by lowering the resistance value. However, if the time is to be appreciably reduced in this manner a falsely low capacitance value will result where the capacitor has even a normal amount of ESR let alone the high values associated with the new double layer capacitors. Use of the constant current test provides even more erroneous measurements because increasing the charging current in order to decrease the time of the test magnifies the effect of ESR. As a consequence, use of the prior art methods of measuring capacitance requires long periods of time unless large error factors can be tolerated.

SUMMARY OF THE INVENTION

Briefly, in accordance with the teachings of the present invention, the capacitor under test is charged by a train of constant current pulses and the voltage across the capacitor is sampled between the charging pulses when the charging current is zero. The number of pulses required to charge the capacitor between two different voltage levels is counted and used to calculate the capacitance of the capacitor. Since the voltage across the capacitor is measured only when the charging current is zero, ESR has no effect on this test even though high levels of charging current are used.

Using the preferred embodiment of the invention described in detail hereinafter, the capacitance of a one Farad capacitor having ESR of one ohm or more can be accurately measured in less than two seconds. Consequently, this novel method is particularly suited for measuring the capacitance of double layer capacitors.

GENERAL DESCRIPTION OF THE DRAWINGS

The present invention will be better understood by a reading of the following detailed description taken in connection with the accompanying drawing wherein.

DETAILED DESCRIPTION OF A PREFERRED EMBODIMENT OF THE INVENTION

Figure 1:
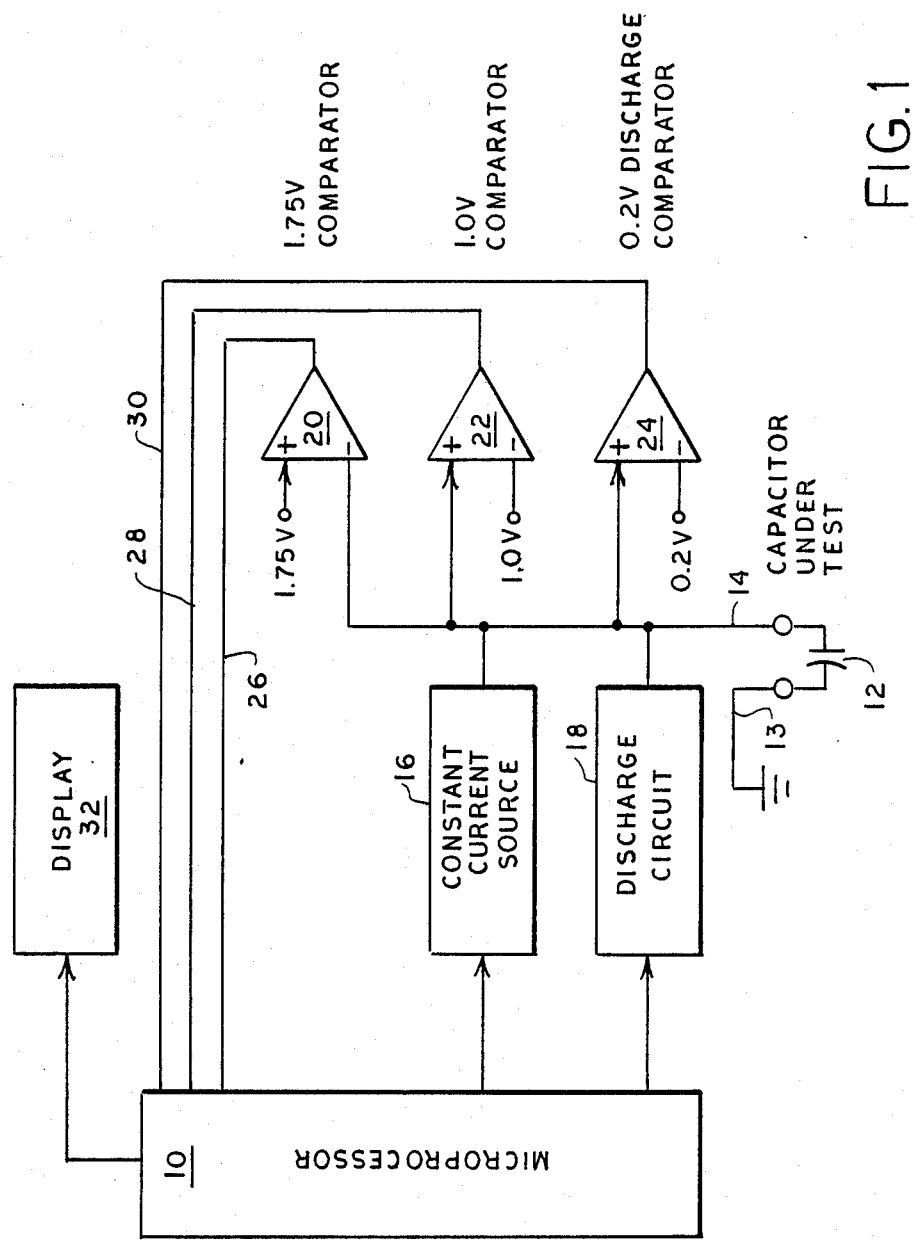
FIG. 1 is a block diagram of an instrument for capacitance measuring embodying the present invention.

Referring to FIG. 1, a microprocessor 10 provides complete timing, system control and value calculation for the capacitance measuring instrument. A capacitor under test is identified by the reference number 12 and has one of its terminals connected to ground via a lead 13 and its other terminal connected to a lead 14. The lead 14 may be seen to be connected to the output of a constant current source 16 which is under the control of the microprocessor 10 and to a discharge circuit 18 which is also under the control of the microprocessor 10. Lead 14 may be seen to be also connected to one of the inputs of each of three voltage comparators 20, 22 and 24. The other input terminal to the voltage comparator 20, the positive terminal, is connected to a D.C. voltage source of 1.75 volts wherefor a signal will appear at the output of the comparator 20 when the voltage on the lead 14 and thus across the capacitor 12 is at 1.75 volts or more. The output signal from the voltage comparator 20 is coupled via a line 26 to an input terminal of the microprocessor 10.

The negative input terminal of the voltage comparator 22 is connected to a source of D.C. voltage at a level of 1.0 volts and it produces an output signal when the voltage on the lead 14 is at one volt or more. The negative lead of the voltage comparator 24 is connected to a D.C. voltage source having a value of 0.2 volts whereby it produces an output signal when the voltage on the lead line 14 is less than 0.2 volts. The output of the voltage comparator 22 is connected via a line 28 to an input of the microprocessor 10, and the output of the voltage comparator 24 is connected to another input of the microprocessor 10 via a line 30. When operation of the instrument is initiated with a capacitor 12 under test connected in the circuit, the microprocessor 10 senses the voltage level on the line 30, and if it indicates the voltage across the capacitor 12 is greater than 0.2 volts, the discharge circuit 18 is activated to discharge the capacitor until the voltage thereacross is no greater than 0.2 volts. Once the capacitor has been discharged and is thus ready for testing, the microprocessor 10 pulses the constant current source 16 which then supplies pulsed current to the capacitor 12 until the voltage on the lead 14 reaches a level of 1.0 volts during the zero current state. At that time the voltage comparator 22 provides an output signal on the line 28 which causes the microprocessor 10 to begin counting the number of current pulses applied to the capacitor 12 and the charging of the capacitor 12 by the constant current pulses is continued until the voltage level on the lead 14 reaches 1.75 volts during the zero current state. When this voltage level is reached, an output signal is provided by the comparator 20 on the line 26 which causes the microprocessor 10 to terminate the charging of the capacitor 12. At this same instant the counter in the microprocessor has stored the number of charging pulses which have been applied to the capacitor under test in order to raise the voltage across it from 1.0 volts to 1.75 volts, and this number is proportional to the capacitance of the capacitor 12. It will be understood by those skilled in the art that the particular voltage levels between which the capacitor is charged by the pulsating constant current is not critical but has been found to provide satisfactory results. When the voltage across the capacitor 12 has reached 1.75 volts the value of the capacitance calculated by the microprocessor 10 is then displayed by the display 32.

In accordance with an important aspect of the present invention the voltage on the lead 14 and thus the output signal from the voltage comparator 20 is tested by the microprocessor only during those intervals between the charging pulses while the charging current is zero. As a consequence, the voltage across the capacitor 12 is measured only when there is no charging current to the capacitor, wherefor the entire voltage which is measured is that resulting from the charge on the capacitor and is not affected by any voltage drop across the equivalent series resistance of the capacitor.

Figure 2:
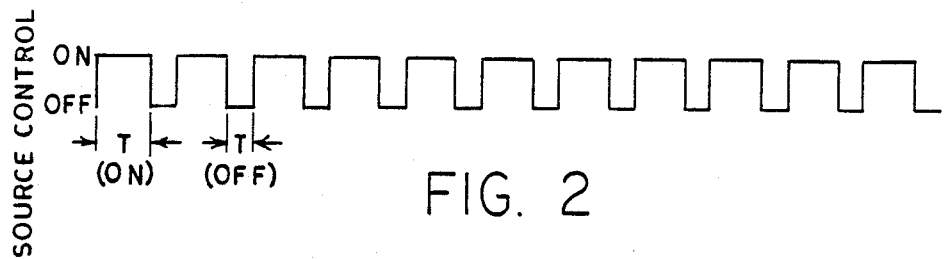
FIG. 2 is the control signal for a train of current pulses used to charge the capacitor under test in the circuit of FIG. 1.
Figure 3:
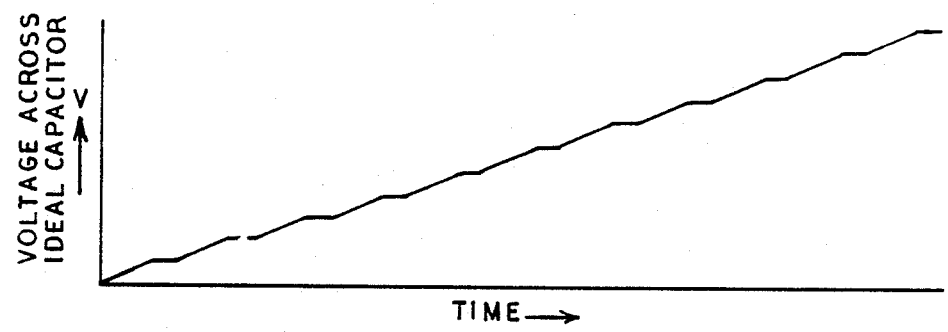
FIG. 3 is the charging curve of an ideal capacitor having no ESR while the capacitor is being charged by the current pulses shown in FIG. 2.
Figure 4:
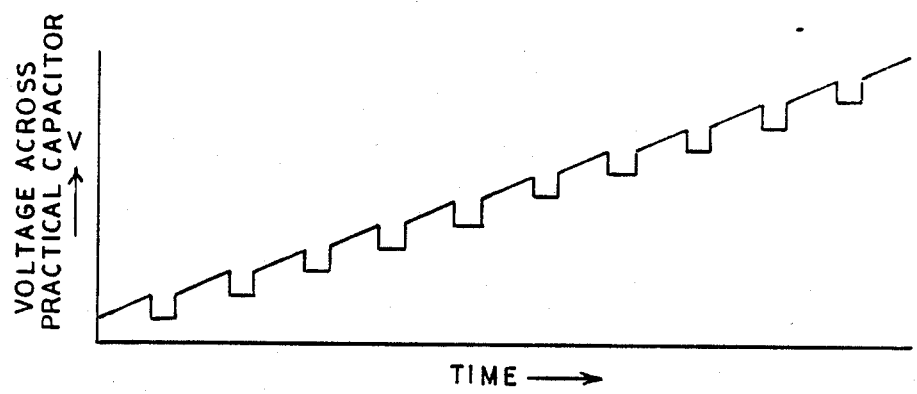
FIG. 4 is the charging curve of a normal capacitor having ESR while the capacitor is being charged by the current pulses shown in FIG. 2.

Referring to FIG. 3, there is shown a curve of the voltage across an ideal capacitor having no equivalent series resistance as it is being charged by a constant current pulse source. It may be seen that during each charging pulse the voltage increases linearly and remains constant during the periods between the charging pulses. FIG. 4, however, shows a normal capacitor having ESR as the capacitor is being charged with the current pulses shown in FIG. 2. A comparison of the curve shown in FIG. 4 with that of FIG. 3 will indicate that during each charging pulse the voltage across the capacitor increases linearly, but at the end of the pulse the measured voltage drops by an amount equal to the product of the charging current and the equivalent series resistance. The voltage then remains constant throughout the intermediate period after which the voltage across the capacitor increases when the next charging pulse is applied.

In accordance with the teachings of the present invention the voltage measurements across the capacitor are made only during the periods between charging pulses where there is no component in the measured voltage corresponding to the voltage drop across the equivalent series resistance. Since the capacitance of the capacitor 12 is directly related to the amplitude of the constant current charging pulses, as shown in FIG. 2, the voltage differential detected by the voltage comparators 20 and 22 and the number of current pulses required to raise the voltage across the capacitor from 1.0 to 1.75 volts enables the capacitance of the capacitor under test to be readily calculated by the microprocessor 10.

The manner in which the capacitance value is calculated is derived from the basic equation.

$$C = (Idt/dV)$$

Where
  I is the charging current
  dt is the time of charging
  dV is the change in voltage across the capacitor during the time dt.
Using the parameters of the circuit of FIG. 2,
  dV = 0.75 volts
  I = 0.477 amps.

Assuming the capacitor under test has a capacitance of one Farad we can determine from the above equations that dt is 1.5723 seconds. Also, assuming a desired resolution of 0.01 Farads, one-hundred pulses must be counted during the charging period of 1.5723 seconds wherefor each charging pulse must have a duration of 15.723 milliseconds.

Hence, the capacitance is calculated by the microprocessor in accordance with the following algorithm:

$$C = (I\, Npt/dv)$$

C = capacitance of the capacitor under test.
  I = amplitude of the charging pulses.
  t = duration of each charging pulse.
  dV = 0.75 volts
  Np = number of charging pulses counted.

Inasmuch as Np is the only variable, the capacitance is readily calculated from the value of Np.

The period between charging pulses is not significant but only need be long enough for the effects of circuit transients to be minimal. An off period of two milliseconds has been found to be sufficient without unduly increasing the duration of the test. Consequently the total time of each charging cycle is 17.723 milliseconds, and the time required to measure the capacitance of a one Farad capacitor is 1.7723 seconds.

It will be understood that other values of charging current, differential voltage and pulse duration can be used if desired, which values must, however, be related in accordance with the above described algorithm.

It may thus be seen that the present invention provides a novel method and instrument for accurately measuring capacitance, and it is particularly suited for measuring the capacitance of large capacitors having relatively high values of equivalent series resistance.

While the present invention has been described in connection with a particular embodiment thereof, it will be understood by those skilled in the art that many changes may be made without departing from the true spirit and scope of the present invention. Therefore, it is intended by the appended claims to cover all such changes and modifications which come within the true spirit and scope of this invention.

What is claimed:

1. A method of measuring the capacitance of a capacitor comprising the steps of
    applying to said capacitor a train of constant current charging pulses to increase the voltage across said capacitor,
    sampling the voltage across said capacitor only during the periods between said pulses,
    counting the number of current pulses applied to said capacitor to raise the voltage across said capacitor a predetermined amount, and
    using said number to calculate the capacitance of said capacitor.

2. A method according to claim 1 wherein said capacitor is charged to a first level of voltage by applying said train of pulses to said capacitor.

3. A method according to claim 2 wherein said first level of voltage is predetermined.

4. A method according to claim 3 wherein said step of counting is carried out by counting the number of pulses required to raise said voltage from said first level of voltage to a second predetermined level of voltage.

5. A method according to claim 4 wherein said step of applying said train of current pulses is terminated when the voltage across said capacitor reaches said second predetermined level, and then discharging said capacitor to a voltage level less than said first level and repeating said earlier stated steps.

6. A method of measuring the capacitance of a capacitor, comprising the steps of
    charging said capacitor to a first predetermined level of voltage,
    applying to said capacitor a train of constant current pulses to increase the voltage across said capacitor,
    sampling and measuring the voltage across said capacitor only during the periods between said pulses,
    measuring the time period during which the voltage across said capacitor is raised from said first predetermined level to a second predetermined level, and
    using said time period and the level of said constant current pulses to calculate the capacitance of said capacitor according to the following algorithm:

$$C = (I\,N_p t/dV)$$

C = capacitance of said capacitor
$N_p$ = number of charging pulses
dV = voltage differential between said first and second predetermined values
t = duration of each charging pulse.

7. An instrument for measuring the capacitance of a capacitor, comprising in combination
    means for generating a train of constant current pulses,
    means for connecting said train of pulses to said capacitor,
    first comparator means for comparing the voltage level across said capacitor with a first predetermined voltage level,
    second comparator means for comparing the voltage level across said capacitor with a second predetermined voltage level,
    microprocessor means responsive to the outputs from said first and second comparator means for counting the number of said pulses connected to said capacitor between the time when said voltage is at said first level and the time when said voltage is at said second level, and
    said microprocessor means being responsive to said number of pulses for calculating and displaying the capacitance of said capacitor.

* * * * *